(12) United States Patent
Okada et al.

(10) Patent No.: US 9,978,987 B2
(45) Date of Patent: May 22, 2018

(54) LIGHT EMITTING DEVICE AND METHOD OF MANUFACTURING A LIGHT EMITTING DEVICE

(71) Applicant: Pioneer Corporation, Tokyo (JP)

(72) Inventors: Takeru Okada, Kawasaki (JP); Ayako Yoshida, Kawasaki (JP)

(73) Assignee: PIONEER CORPORATION, Tokyo (JP)

( * ) Notice: Subject to any disclaimer, the term of this patent is extended or adjusted under 35 U.S.C. 154(b) by 0 days. days.

(21) Appl. No.: 15/128,384

(22) PCT Filed: Mar. 24, 2014

(86) PCT No.: PCT/JP2014/058041
§ 371 (c)(1),
(2) Date: Sep. 22, 2016

(87) PCT Pub. No.: WO2015/145533
PCT Pub. Date: Oct. 1, 2015

(65) Prior Publication Data
US 2017/0104178 A1    Apr. 13, 2017

(51) Int. Cl.
*H01L 51/52* (2006.01)
*H01L 51/00* (2006.01)
*B32B 27/08* (2006.01)

(52) U.S. Cl.
CPC .......... *H01L 51/5253* (2013.01); *B32B 27/08* (2013.01); *H01L 51/003* (2013.01);
(Continued)

(58) Field of Classification Search
CPC .................................................. H01L 51/0097
See application file for complete search history.

(56) References Cited

U.S. PATENT DOCUMENTS 5,955,837 A    9/1999    Horikx et al.
7,279,239 B2   10/2007   Akedo et al.
(Continued)

FOREIGN PATENT DOCUMENTS

JP    2000503163 A    3/2000
JP    2004001296 A    1/2004
(Continued)

OTHER PUBLICATIONS

International Search Report, PCT/JP2014/058041, 2 pages.
(Continued)

*Primary Examiner* — Moazzam Hossain
(74) *Attorney, Agent, or Firm* — Procopio, Cory, Hargreaves & Savitch LLP (57) ABSTRACT

A light emitting portion (200) is formed on a first surface of a substrate (100) (upper surface of the substrate (100) in an example illustrated in FIG. 1). A sealing member (300) seals the light emitting portion (200). In addition, the substrate (100) includes a first resin layer (110), a first inorganic layer (120), and a second resin layer (130). The first resin layer (110) is formed of a first resin material. The second resin layer (130) is formed of the first resin material, and is positioned closer to the first surface side of the substrate (100) than the first resin layer (110). The first inorganic layer (120) is positioned between the first resin layer (110) and the second resin layer (130).

13 Claims, 7 Drawing Sheets

(52) U.S. Cl.
CPC ........ *H01L 51/004* (2013.01); *H01L 51/0097* (2013.01); *H01L 51/5268* (2013.01); *B32B 2307/422* (2013.01); *B32B 2457/00* (2013.01); *B32B 2457/206* (2013.01); *Y02E 10/549* (2013.01); *Y02P 70/521* (2015.11)

(56) References Cited

U.S. PATENT DOCUMENTS

| | | | |
|---|---|---|---|
| 7,466,390 B2 | 12/2008 | French et al. | |
| 8,389,983 B2 | 3/2013 | Seo et al. | |
| 8,759,126 B2 | 6/2014 | Kuranaga et al. | |
| 8,963,171 B2 | 2/2015 | Kuranaga et al. | |
| 2004/0222522 A1* | 11/2004 | Homma | H01L 21/563 257/737 |
| 2004/0247949 A1 | 12/2004 | Akedo et al. | |
| 2007/0091062 A1 | 4/2007 | French et al. | |
| 2009/0015148 A1* | 1/2009 | Hanari | H01L 27/3246 313/504 |
| 2009/0288852 A1* | 11/2009 | Hirokawa | H01L 23/055 174/50.52 |
| 2011/0140164 A1* | 6/2011 | Seo | H01L 51/5256 257/100 |
| 2011/0260180 A1 | 10/2011 | Kuranaga et al. | |
| 2012/0228617 A1* | 9/2012 | Ko | H01L 51/0097 257/59 |
| 2013/0181204 A1 | 7/2013 | Kuranaga et al. | |
| 2013/0182418 A1* | 7/2013 | Sawabe | F21L 4/00 362/157 |
| 2014/0294470 A1* | 10/2014 | Coggan | G03G 15/206 399/333 |

FOREIGN PATENT DOCUMENTS

| | | |
|---|---|---|
| JP | 2004087253 A | 3/2004 |
| JP | 2005212229 A | 8/2005 |
| JP | 2007512568 A | 5/2007 |
| JP | 2007169304 A | 7/2007 |
| JP | 2011124228 A | 6/2011 |
| JP | 2011227369 A | 11/2011 |
| JP | 2012189974 A | 10/2012 |
| JP | 2013077410 A | 4/2013 |
| JP | 2014026785 A | 2/2014 |
| WO | 2011010582 A1 | 1/2011 |

OTHER PUBLICATIONS

Office Action for Japanese Patent Application No. 2016509633 dated Oct. 3, 2017. 2 pages.
Office Action for related Korean Patent Application No. 10-2016-7029276, dated Feb. 2, 2018; English translation provided, (23 pages).

* cited by examiner

LIGHT EMITTING DEVICE AND METHOD OF MANUFACTURING A LIGHT EMITTING DEVICE

CROSS-REFERENCE TO RELATED APPLICATIONS

This application is a U.S. National Stage entry of PCT Application No. PCT/JP2014/058041, filed on Mar. 24, 2014, the contents of which are incorporated by reference.

TECHNICAL FIELD

The present invention relates to a light emitting device and a method of manufacturing a light emitting device.

BACKGROUND ART

Recently, development of organic EL elements is proceeding. It has been carried out on the use of a resin film as a substrate for forming an organic EL element. For example, Patent Document 1 discloses alternately laminating a resin film, which is a polymer film, and an inorganic film on both surfaces of a resin film substrate, and then forming a light emitting element on the resin film substrate. In Patent Document 1, the resin film substrate is formed of polyethylene terephthalate and the like, the resin film is formed of an ultraviolet curable monomer and the like, and the inorganic film is formed of $SiO_2$, $Al_2O_3$, ZnO, ITO, and the like.

In addition, Patent Document 2 discloses forming a polyimide molded article by applying varnish onto a support such as a glass substrate or a resin film, drying and curing the varnish, and then removing the support.

RELATED DOCUMENT

Patent Document

[Patent Document 1] Japanese Patent Application Laid-Open Publication No. 2004-1296
[Patent Document 2] Japanese Patent Application Laid-Open Publication No. 2007-169304

SUMMARY OF THE INVENTION

The present inventors have considered forming a resin substrate on a support substrate, then forming a light emitting portion on the resin substrate, and then removing the support substrate. In such a structure, it is preferable that the resin substrate has a multilayer structure. However, thermal stress may occur in the resin substrate due to the multilayer structure after the resin substrate is peeled off from the support substrate. In a case where thermal stress occurs in the resin substrate, warping may occur in the light emitting device.

An exemplary object of the present invention is to prevent the occurrence of warping in the light emitting device even in a case where the resin substrate and the light emitting portion are formed on the support substrate, and thereafter, the support substrate is removed from the resin substrate.

The invention according to claim 1 is a light emitting device including: a flexible substrate; a light emitting portion formed over a first surface of the substrate; and a sealing portion sealing the light emitting portion, in which the substrate includes a first resin layer which has a first resin material, a second resin layer which has the first resin material and is positioned closer to the first surface side than the first resin layer, and a first inorganic layer which is positioned between the first resin layer and the second resin layer.

The invention according to claim 8 is a method of manufacturing a light emitting device including the steps of: forming a substrate over a support substrate; forming a light emitting portion over the substrate; and forming a sealing portion sealing the light emitting portion over the substrate, in which the step of forming the substrate includes the steps of: forming a first resin layer over the support substrate by using a first resin material, forming a first inorganic layer over the first resin layer, and forming a second resin layer over the first inorganic layer by using the first resin material.

The object described above, other objects, characteristic, and advantages will be more obvious by preferred embodiments described below and the following drawings associated with the embodiments.

DESCRIPTION OF EMBODIMENTS

Hereinafter, embodiments of the present invention will be described by using the drawings. Furthermore, in all the drawings, the same reference numerals are applied to the same constituents, and the description thereof will not be repeated.

Figure 1:
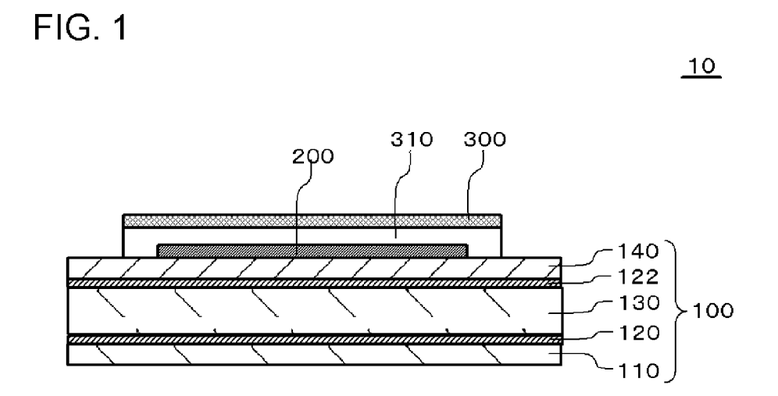
FIG. 1 is a sectional view illustrating a configuration of a light emitting device according to an embodiment.

FIG. 1 is a sectional view illustrating a configuration of a light emitting device 10 according to an embodiment. The light emitting device 10 according to the embodiment includes a flexible substrate 100, a light emitting portion 200, and a sealing member 300 (a sealing portion). The light emitting portion 200 is formed on a first surface of the substrate 100 (upper surface in an example illustrated in FIG. 1). The sealing member 300 seals the light emitting portion 200. In addition, the substrate 100 includes a first resin layer 110, a first inorganic layer 120, and a second resin layer 130. The first resin layer 110 is formed of a first resin material. The second resin layer 130 is formed of the first resin material, the second resin layer 130 being positioned closer to the first surface side of the substrate 100 than the first resin layer 110. The first inorganic layer 120 is positioned between the first resin layer 110 and the second resin layer 130. The thickness of the substrate 100, for example, is greater than or equal to 20 µm and less than or equal to 300 µm. Hereinafter, the details will be described.

The first resin layer 110 and the second resin layer 130, for example, are formed by applying a first resin material onto a support substrate 400 (described below by using FIGS. 2 and 3). The first resin material is preferably a resin having an imide bond, for example, a polyimide resin. In addition, the first resin layer 110 is preferably thinner than the second resin layer 130. The film thickness of the first resin layer 110, for example, is greater than or equal to 5 µm and less than or equal to 100 µm, and the film thickness of the second resin layer 130, for example, is greater than or equal to 10 µm and less than or equal to 200 µm. The second resin layer 130 may be formed of a resin material which is different from the first resin layer 110.

Furthermore, the surface of the substrate 100 on a side opposite to the first surface (a second surface: a surface on a lower side in FIG. 1) is formed of the first resin layer 110. A surface roughness Ra of the second surface is lower than a surface roughness Ra of the surface of the first resin layer 110 on a side opposite to the second surface (in the example illustrated in FIG. 1, a surface which is in contact with the first inorganic layer 120). As described below, this is because the first resin layer 110 is formed by using the support substrate 400.

The first inorganic layer 120, for example, is a silicon oxide film, a silicon nitride film, or a silicon oxynitride film, and functions as a film (a moisture proof film and/or a barrier film) which prevents moisture or oxygen from being transmitted through the substrate 100 in a thickness direction. The film thickness of the first inorganic layer 120, for example, is greater than or equal to 20 nm and less than or equal to 2 µm. In addition, a ratio of the thickness of the first inorganic layer 120 to the thickness of the substrate 100, for example, is greater than or equal to 0.01% and less than or equal to 10%. The first inorganic layer 120, for example, is formed by using vapor phase growth methods such as a sputtering method, a CVD method, or an ALD method. The first inorganic layer 120 is formed of a material having a Young's modulus which is higher than that of the first resin material. For this reason, the Young's modulus of the first inorganic layer 120 is greater than that of the first resin layer 110 and that of the second resin layer 130.

In addition, in the example illustrated in FIG. 1, the substrate 100 includes a third resin layer 140. The third resin layer 140 is formed closer to the first surface side of the substrate 100 than the second resin layer 130, and is disposed for planarizing the first surface of the substrate 100. The third resin layer 140, for example, is formed of a photocurable acrylic resin. The linear expansion coefficient of the material (a second resin material) configuring the third resin layer 140 is different from the linear expansion coefficient of the first resin material. The linear expansion coefficient of the material (the second resin material) configuring the third resin layer 140 may be greater than the linear expansion coefficient of the first resin material, or may be less than the linear expansion coefficient of the first resin material.

In addition, in the example illustrated in FIG. 1, the substrate 100 includes a second inorganic layer 122 between the second resin layer 130 and the third resin layer 140. The second inorganic layer 122 has the same configuration as that of the first inorganic layer 120. In this case, an inorganic layer exists on a first surface side and a second surface side of the second resin layer 130, and thus, it is possible to suppress the occurrence of warping in the substrate 100. Furthermore, the second inorganic layer 122 may be omitted.

Furthermore, in a case where the light emitting device 10 is a bottom emission type light emitting device, each layer configuring the substrate 100 has light transmissivity with respect to light emitted from the light emitting portion 200.

The light emitting portion 200 is formed on the first surface of the substrate 100. The light emitting portion 200 includes a light emitting element such as an organic EL element. In a case where the light emitting element is an organic EL element, the light emitting element has a configuration in which the organic layer is interposed between a first electrode and a second electrode.

At least one of the first electrode and the second electrode is a light transmissive electrode. In addition, the other electrode, for example, is formed of metal such as Al or Ag. The light transmissive electrode, for example, is a mesh-like electrode of which the material is a nanowire formed of an inorganic material such as Indium Tin Oxide (ITO) or Indium Zinc Oxide (IZO), a conductive polymer such as a polythiophene derivative, or silver or carbon. In a case where the light emitting element is a bottom emission type light emitting device, an electrode on the substrate 100 side is the light transmissive electrode, and an electrode on a side opposite to the substrate 100 is an electrode formed of Al, Ag, and the like which reflects light. In addition, in a case where the light emitting element is a top emission type light emitting device, the electrode on a side opposite to the substrate 100 is the light transmissive electrode, and the electrode on the substrate 100 side is the electrode formed of Al, Ag, and the like which reflects light. Furthermore, the light emitting element may be a light transmissive light emitting device in which both of the electrodes (the first electrode and the second electrode) are light transmissive electrodes (a dual emission type light emitting device).

The organic layer has a configuration in which a hole transport layer, a light emitting layer, and an electron transport layer are laminated in this order. In a case where the first electrode is a positive electrode, the hole transport layer is formed on the first electrode. In addition, in a case where the first electrode is a negative electrode, the electron transport layer is formed on the first electrode. Furthermore, the hole injection layer may be disposed between the hole transport layer and the light emitting layer, or the electron injection layer may be disposed between the electron transport layer and the light emitting layer. Each layer of the organic layer may be formed by a coating method or may be formed by a vapor deposition method, or a part thereof may be formed by a coating method and the remaining part may be formed by a vapor deposition method. Furthermore, the organic layer may be formed by a vapor deposition method using a vapor deposition material, and may be formed by an ink jet method, a printing method, and a spray method using a coating material.

Furthermore, in a case where the light emitting device 10 is an illumination device, the light emitting portion 200 may include only one light emitting element, or may include a plurality of light emitting elements. In the latter case, the light emitting portion 200 may include a plurality of light emitting elements emitting light having colors which are different from each other (for example, red, green, and blue). In this case, terminals of the plurality of types of light emitting elements are disposed to be independent from each other. In addition, in a case where the light emitting portion 200 is a display device, the plurality of types of light emitting elements are arranged in the light emitting portion 200 in the shape of a matrix.

The light emitting portion 200 is sealed by the sealing member 300. In the example illustrated in this drawing, the light emitting portion 200 is a metal foil or a metal plate (for example, an Al foil or an Al plate), and is fixed to the first surface of the substrate 100 by using an adhesive layer 310.

Figure 2:
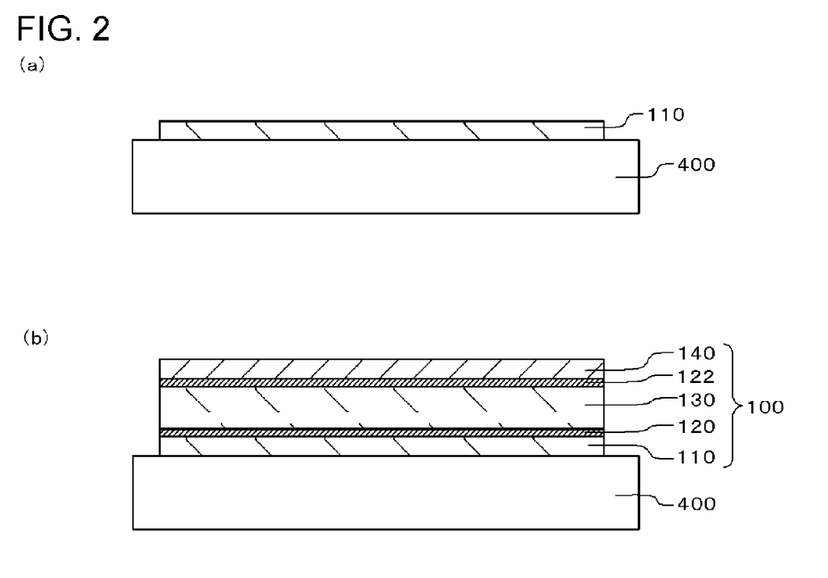
FIGS. 2(a) and 2(b) are sectional views illustrating a method of manufacturing the light emitting device illustrated in FIG. 1.
Figure 3:
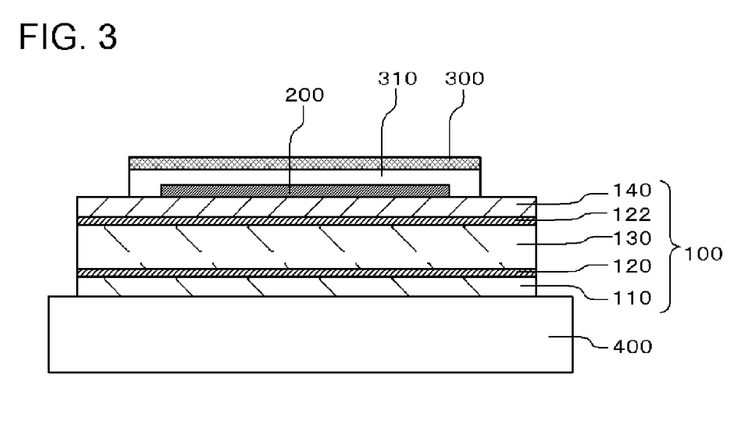
FIG. 3 is a sectional view illustrating a method of manufacturing the light emitting device illustrated in FIG. 1.

FIG. 2 and FIG. 3 are sectional views illustrating a method of manufacturing the light emitting device 10 illustrated in FIG. 1. First, as illustrated in each drawing of FIG.

2, the substrate 100 is formed by using the support substrate 400. The support substrate 400, for example, is a glass substrate, and has a lower surface roughness Ra. In this case, the surface roughness Ra of the support substrate 400 which is the glass substrate may be less than the surface roughness Ra on the second surface side of the first resin layer 110.

Specifically, as illustrated in FIG. 2(a), the first resin material is applied onto the support substrate 400, and thus the first resin layer 110 is formed. The first resin layer 110, for example, is formed by using a die coater, and may be formed by using a spin coating method or a screen printing method. As described above, since the surface roughness Ra of the support substrate 400 is low, the surface roughness Ra of the second surface (the surface on the support substrate 400 side) of the first resin layer 110 is also low.

Next, as illustrated in FIG. 2(b), the first inorganic layer 120 is formed on the first resin layer 110 by using a vapor phase growth method. Next, the second resin layer 130 is formed on the first inorganic layer 120. A formation method of the second resin layer 130 is similar to that of the first resin layer 110. Further, the second inorganic layer 122 is formed on the second resin layer 130. A formation method of the second inorganic layer 122 is similar to that of the first inorganic layer 120. Further, the third resin layer 140 is formed on the second inorganic layer 122. A formation method of the third resin layer 140 is also similar to that of the first resin layer 110. Thus, the substrate 100 is formed. Furthermore, in a case where the second inorganic layer 122 is omitted, the third resin layer 140 is formed on the second resin layer 130.

Thus, by superposing the first inorganic layer 120, the second resin layer 130, the second inorganic layer 122, and the third resin layer 140, defects (also called voids) of the first inorganic layer 120 are filled with the second resin layer 130. However, moisture, oxygen, or the like may infiltrate through a part of the second resin layer 130 filling the defect. Regardless, in the example illustrated in FIG. 2(b), the second inorganic layer 122 is formed on the second resin layer 130, and thus, it is possible to prevent such moisture, oxygen, or the like from infiltrating. In addition, the third resin layer 140 is formed on the second inorganic layer 122, and thus, it is possible to more flatly form a lower electrode described below. In this case, it is possible to suppress the occurrence of a leakage or the like.

Next, as illustrated in FIG. 3, the first electrode, the organic layer, and the second electrode of the light emitting portion 200 are formed on the substrate 100 in this order in a state where the substrate 100 is positioned on the support substrate 400. The sealing member 300 is then fixed to the substrate 100 by using the adhesive layer 310. Thereafter, the substrate 100, the light emitting portion 200, and the sealing member 300 are detached from the support substrate 400.

In the forming step of the light emitting device 10 described above, the substrate 100 is heated. For this reason, thermal stress occurs in the substrate 100. The thermal stress is caused by the first inorganic layer 120 and the second inorganic layer 122 in addition to the first resin layer 110, the second resin layer 130, and the third resin layer 140 described above. For example, the magnitude of thermal deformation which occurs in the first resin layer 110 and the second resin layer 130 is larger than the magnitude of thermal deformation which occurs in the first inorganic layer 120 and the second inorganic layer 122.

Furthermore, a plurality of light emitting devices 10 is formed by using one support substrate 400, and thereafter, the plurality of light emitting devices 10 may be separated from each other. This separating step may be performed before the substrate 100, the light emitting portion 200, and the sealing member 300 are detached from the support substrate 400, or may be performed after the substrate 100, the light emitting portion 200, and the sealing member 300 are detached from the support substrate 400. In the latter case, the support substrate 400 may be reused.

As described above, according to this embodiment, the substrate 100 includes the first inorganic layer 120 between the first resin layer 110 and the second resin layer 130. The Young's modulus of the material configuring the first inorganic layer 120 is higher than the Young's modulus of the material configuring the first resin layer 110 and the second resin layer 130. For this reason, even when the substrate 100 is detached from the support substrate 400, it is possible to prevent the substrate 100 from warping due to thermal stress. In addition, since the first resin layer 110 and the second resin layer 130 are formed of the same resin material (the first resin material), warping of the substrate 100 can be prevented, compared to when the first resin layer 110 and the second resin layer 130 are formed of resin materials which are different from each other. Further, forming the second inorganic layer 122 allows arrangement of the inorganic layers having high Young's moduli on both sides of the substrate 100, and thus, it is possible to further prevent the substrate from warping.

In particular, in this embodiment, the substrate 100 includes the third resin layer 140. The third resin layer 140 is formed of a material which is different from that of the first resin layer 110 and the second resin layer 130, and thus, thermal stress particularly easily occurs in the substrate 100. Regardless, as described above, since the substrate 100 includes the first inorganic layer 120, it is possible to prevent the substrate 100 from warping due to thermal stress.

In addition, the first resin layer 110 is disposed between the support substrate 400 and the first inorganic layer 120. For this reason, the substrate 100 is easily peeled off from the support substrate 400, compared to a case where the support substrate 400 is in contact with the first inorganic layer 120.

EXAMPLES

Example 1

Figure 4:
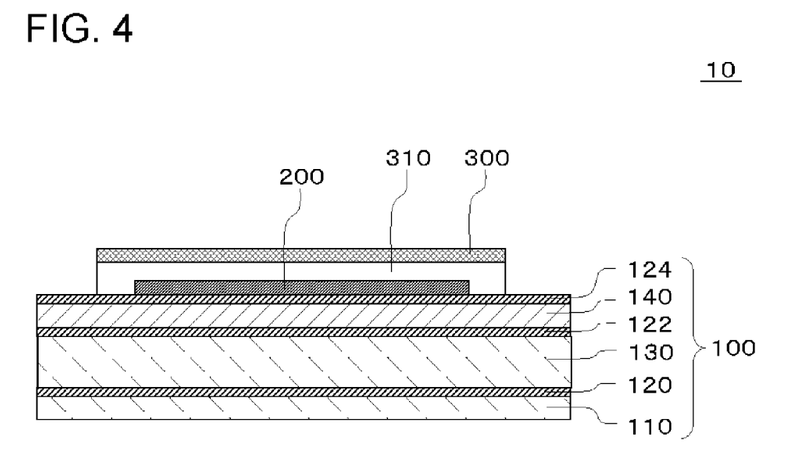
FIG. 4 is a sectional view illustrating a configuration of a light emitting device according to Example 1.

FIG. 4 is a sectional view illustrating a configuration of the light emitting device 10 according to Example 1. The light emitting device 10 according to this example has the same configuration as that of the light emitting device 10 according to the embodiment except for the configuration of the substrate 100.

In Example 1, the substrate 100 includes a third inorganic layer 124 on the third resin layer 140. For this reason, in this example, the first surface of the substrate 100 is configured of the third inorganic layer 124. The third inorganic layer 124 is formed of the same material as that of the first inorganic layer 120, and is formed by using a similar method as that of the first inorganic layer 120.

According to Example 1, the substrate 100 includes the first inorganic layer 120, and thus, it is possible to prevent the substrate 100 from warping due to thermal stress. In addition, the third inorganic layer 124 is disposed, and thus, it is possible to further prevent the substrate 100 from warping due to thermal stress, and it is possible to further prevent moisture or the like from being transmitted in the thickness direction of the substrate 100.

Example 2

Figure 5:
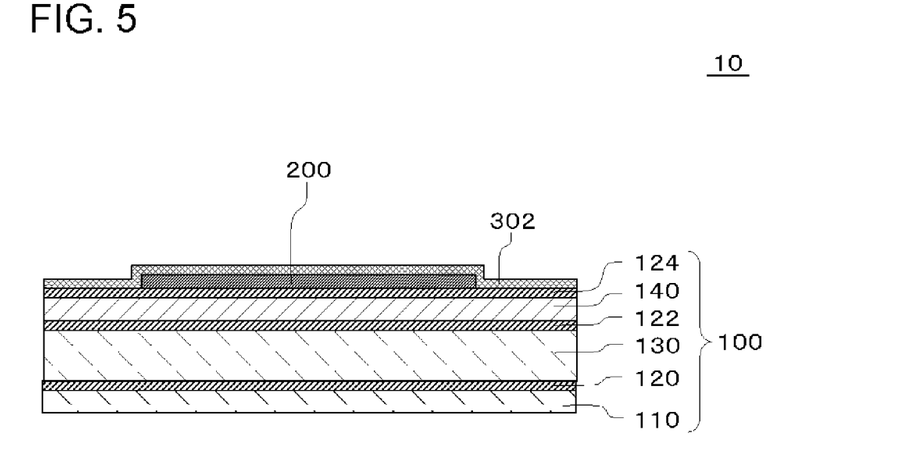
FIG. 5 is a sectional view illustrating a configuration of a light emitting device according to Example 2.

FIG. 5 is a sectional view illustrating a configuration of the light emitting device 10 according to Example 2. The light emitting device 10 according to this example has the same configuration as that of the light emitting device 10 according to the embodiment or Example 1 except that a sealing film 302 (a sealing portion) is formed instead of the sealing member 300. FIG. 5 illustrates the same case as that of Example 1.

The sealing film 302, for example, is an aluminum oxide film, and for example, is formed by using an Atomic Layer Deposition (ALD) method. Furthermore, for example, titanium oxide, silicon oxide, silicon oxynitride, or a laminated body thereof may be used as the material of the sealing film 302. The film thickness of the sealing film 302, for example, is greater than or equal to 10 nm and less than or equal to 2 μm. The sealing film 302 covers the light emitting portion 200 and at least a portion of the substrate 100 positioned around the light emitting portion 200. Furthermore, the sealing film 302 may be formed by a film formation method other than the ALD method, and for example, may be formed by using a CVD method. The sealing film 302 is formed after the light emitting portion 200 is formed and before the support substrate 400 is detached from the substrate 100. The Young's modulus of the substrate 100 on which the sealing film 302 is formed is higher than that of the substrate 100 on which the sealing film 302 is not formed.

According to Example 2, the substrate 100 includes the first inorganic layer 120 and the sealing film 302, and thus, it is possible to prevent the substrate 100 from warping due to thermal stress.

Example 3

Figure 6:
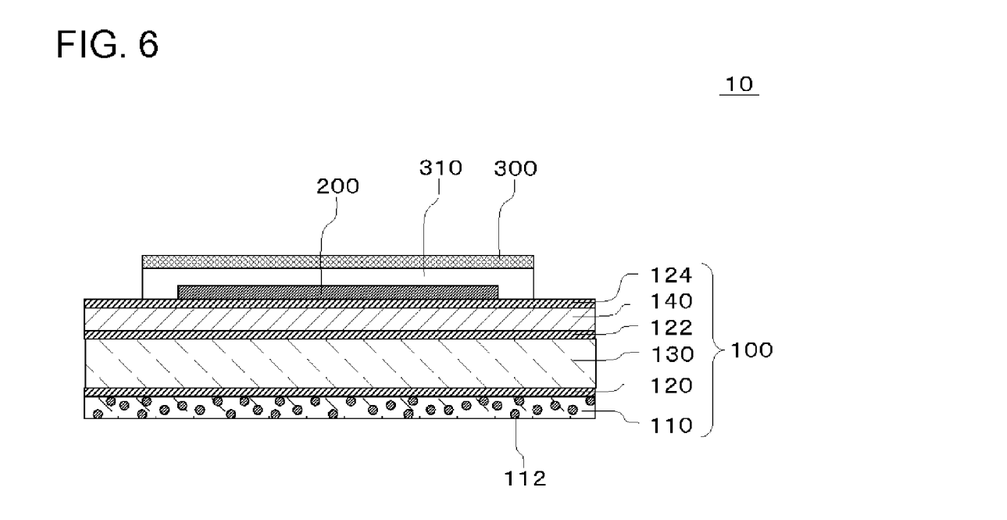
FIG. 6 is a sectional view illustrating a configuration of a light emitting device according to Example 3.

FIG. 6 is a sectional view illustrating a configuration of the light emitting device 10 according to Example 3. The light emitting device 10 according to this example has the same configuration as any one of the embodiment and Examples 1 and 2 except that a plurality of particles 112 are introduced into the first resin layer 110. FIG. 6 illustrates the same case as that of Example 1.

The particles 112 are introduced into the first resin layer 110 in order to increase efficiency of light extraction from the substrate 100 by scattering light. The particles 112, for example, are formed of an inorganic oxide such as titanium oxide, zirconium oxide, yttrium oxide, aluminum oxide, or silicon oxide, and the average particle diameter thereof, for example, is greater than or equal to 20 nm and less than or equal to 2 μm. It is desirable that the refractive index of the material configuring the particles 112 is high. By adjusting the content of the particles 112 in the first resin layer 110, it is possible to set Haze value of the first resin layer 110 to be approximately 90%. The particles 112 are mixed in advance in a coating material which becomes the first resin layer 110 and the second resin layer 130.

Furthermore, a resin layer for planarizing may be disposed between the first resin layer 110 and the first inorganic layer 120. The resin layer, for example, is formed by using the same material as that of the third resin layer 140.

According to Example 3, the substrate 100 includes the first inorganic layer 120, and thus, it is possible to prevent the substrate 100 from warping due to thermal stress. In addition, the plurality of particles 112 introduced into the first resin layer 110 makes it possible to increase light extraction efficiency of the light emitting device 10 even when a light extraction film is not bonded to the first resin layer 110. In addition, since the first resin layer 110 includes the plurality of particles 112, the Young's modulus becomes comparatively high. For this reason, the Young's modulus of the substrate 100 is high compared to when the plurality of particles 112 are not included.

In addition, a part of the particles 112 is in contact with the support substrate 400, and thus, an adhesive force between the first resin layer 110 and the support substrate 400 is weakened. Accordingly, the substrate 100 is easily detached from the support substrate 400. In addition, the thermal expansion coefficient of the first resin layer 110 becomes low by introducing the particles 112. Accordingly, the substrate 100 is rarely warped.

Example 4

Figure 7:
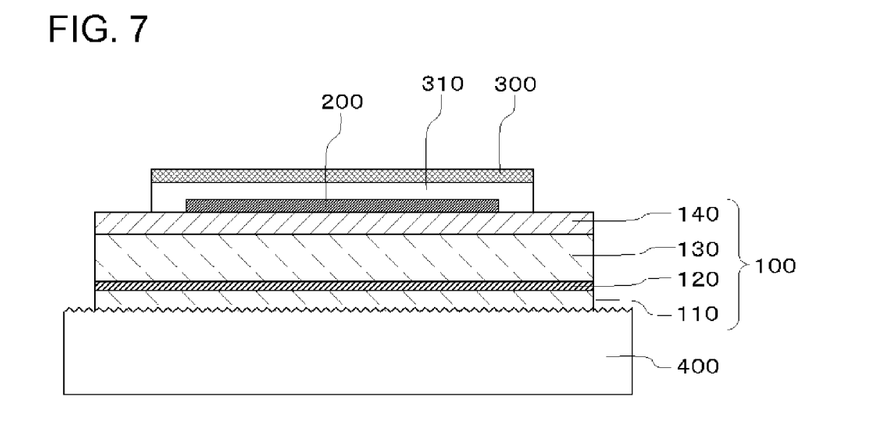
FIG. 7 is a sectional view illustrating a method of manufacturing a light emitting device according to Example 4.

FIG. 7 is a sectional view for illustrating a method of manufacturing the light emitting device 10 according to Example 4, and corresponds to FIG. 3 of the embodiment. The method of manufacturing the light emitting device 10 according to this example has the same configuration as that of the method of manufacturing the light emitting device 10 according to any one of the embodiment and Examples 1 to 3 except that fine concavities and convexities are formed on the surface of the support substrate 400 onto which the substrate 100 is formed. Fine concavities and convexities are formed on the second surface (a light extraction surface) of the first resin layer 110 of the substrate 100. A height difference in the concavities and convexities, for example, is greater than or equal to 50 nm and less than or equal to 5 μm, and a distance between adjacent convex portions, for example, is greater than or equal to 100 nm and less than or equal to 200 μm.

According to Example 4, the substrate 100 includes the first inorganic layer 120, and thus, it is possible to prevent the substrate 100 from warping due to thermal stress. In addition, the fine concavities and convexities are formed on the second surface (the light extraction surface) of the first resin layer 110 of the substrate 100, and thus, even in a case where the light extraction film is not bonded to the first resin layer 110, it is possible to increase the light extraction efficiency of the light emitting device 10.

As described above, the embodiment and the examples will be described with reference to the drawings, but the embodiment and the examples are an example of the present invention, and various configurations other than the configurations described above are able to be adopted.

The invention claimed is:
1. A light emitting device, comprising:
a flexible substrate;
a light emitting portion formed over a first surface of the substrate; and
a sealing portion sealing the light emitting portion,
wherein the substrate includes: a laminated structure comprising one or more resin layer and one or more inorganic layer,
wherein the laminated structure comprises
a first resin layer,
a second resin layer which is positioned closer to the first surface side than the first resin layer,
a first inorganic layer which is positioned between the first resin layer and the second resin layer, a second inorganic layer which is positioned over a first surface side of the second resin layer, and a third resin layer, wherein the second resin layer, the second inorganic layer, and the third resin layer are located in that order.

2. The light emitting device according to claim 1, wherein a thickness of the first resin layer is greater than or equal to 5 μm and less than or equal to 100 μm.

3. The light emitting device according to claim 2, wherein the first resin layer comprises a first resin material comprising an imide bond.

4. The light emitting device according to claim 2, wherein the substrate is formed by forming the first resin layer, the first inorganic layer, the second resin layer, and the second inorganic layer over a support substrate, and then by removing the support substrate.

5. The light emitting device according to claim 4, wherein the first resin layer includes a plurality of particles.

6. The light emitting device according to claim 4, wherein the third resin layer is disposed closer to the first surface side than the second resin layer, and the third resin layer is formed of a second resin material which is different from the first resin material.

7. A light emitting device, comprising:
a flexible substrate;
a light emitting portion formed over a first surface of the substrate; and
a sealing portion sealing the light emitting portion,
wherein the substrate includes a laminated structure comprising one or more resin layer and one or more inorganic layer,
wherein the laminated structure comprises
a first resin layer,
a second resin layer positioned closer to the first surface side than the first resin layer,
a first inorganic layer positioned between the first resin layer and the second resin layer and relax a stress generated in the first resin layer and the second resin layer,
a second inorganic layer positioned over a first surface side of the second resin layer and relax a stress generated in the first resin layer and the second resin layer, and
a third resin layer disposed closer to the first surface side than the second resin layer.

8. The light emitting device according to claim 7, wherein a thickness of the first resin layer is greater than or equal to 5 μm and less than or equal to 100 μm.

9. The light emitting device according to claim 7, wherein the first resin layer comprises a first resin material comprising an imide bond.

10. The light emitting device according to claim 9, wherein the second resin film comprises the first resin material.

11. The light emitting device according to claim 7, wherein the substrate is formed by forming the first resin layer, the first inorganic layer, the second resin layer, and the second inorganic layer over a support substrate, and then by removing the support substrate.

12. The light emitting device according to claim 11, wherein the first resin layer includes a plurality of particles.

13. The light emitting device according to claim 12, wherein
the third resin layer is formed of a second resin material different from the first resin material.

* * * * *